United States Patent [19]

Yamada et al.

[11] Patent Number: 4,995,002
[45] Date of Patent: Feb. 19, 1991

[54] SEMICONDUCTOR MEMORY DEVICE

[75] Inventors: Shigeru Yamada, Yokohama; Takuya Fujimoto, Kawasaki, both of Japan

[73] Assignee: Kabushiki Kaisha Toshiba, Kawasaki, Japan

[21] Appl. No.: 406,421

[22] Filed: Sep. 11, 1989

[30] Foreign Application Priority Data

Sep. 13, 1988 [JP] Japan ................................. 63-229401

[51] Int. Cl.⁵ .......................... G11C 7/00; H01L 21/00
[52] U.S. Cl. ............................ 365/189.01; 365/189.09; 365/181; 365/203
[58] Field of Search ............ 365/154, 181, 174, 189.01, 365/189.09, 189.11, 203

[56] References Cited

U.S. PATENT DOCUMENTS

4,779,231 10/1988 Holzapfel et al. ............... 365/181 X

Primary Examiner—Joseph A. Popek
Attorney, Agent, or Firm—Foley & Lardner, Schwartz, Jeffery, Schwaab, Mack, Blumenthal & Evans

[57] ABSTRACT

A semiconductor memory device in which a data line and a holding circuit for storing data thereon are connected through a transmission gate comprised of an N-type MOS transistor and a P-type MOS transistor, wherein the semiconductor memory device comprises an initial potential setting circuit for setting an initial potiential on the data line prior to readout operation of data from the holding circuit; and a control circuit operative to allow the both transistors of the transmission gate to be turned on at the time of writing data into the holding circuit, and to allow one of the transistors to be turned on at the time of reading data from the holding circuit. Where a hold potential changes when data in the holding circuit has been read out onto the data line, such a change in the hold potential increases on resistance of one of the transistors which has been turned on of the transmission gate. As a result, this change in the hold potential in held down to a small value, so it does not reach the threshold voltage of the holding circuit.

5 Claims, 7 Drawing Sheets

SEMICONDUCTOR MEMORY DEVICE

BACKGROUND OF THE INVENTION

This invention relates to a semiconductor memory device used as a RAM mainly in a CMOS integrated circuit device, etc., and more particularly to a semiconductor memory device having a reduced mask pattern area and free from an erroneous operation at the time of read operation.

Figure 1:
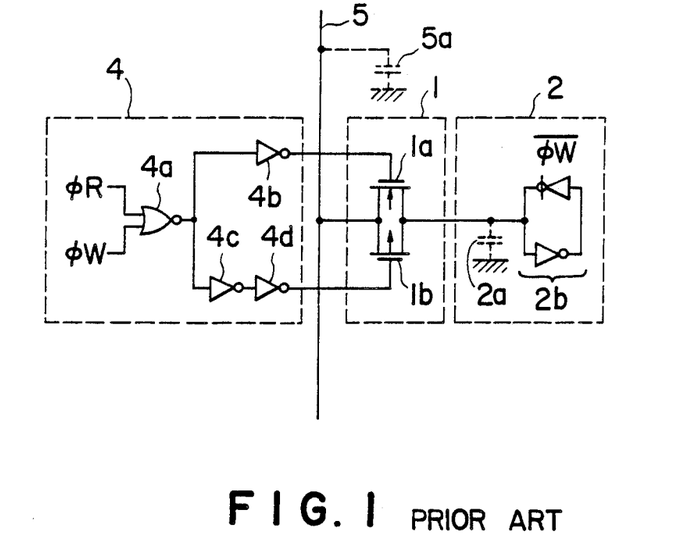
FIG. 1 is a circuit diagram showing an example of a conventional device.
Figure 2:
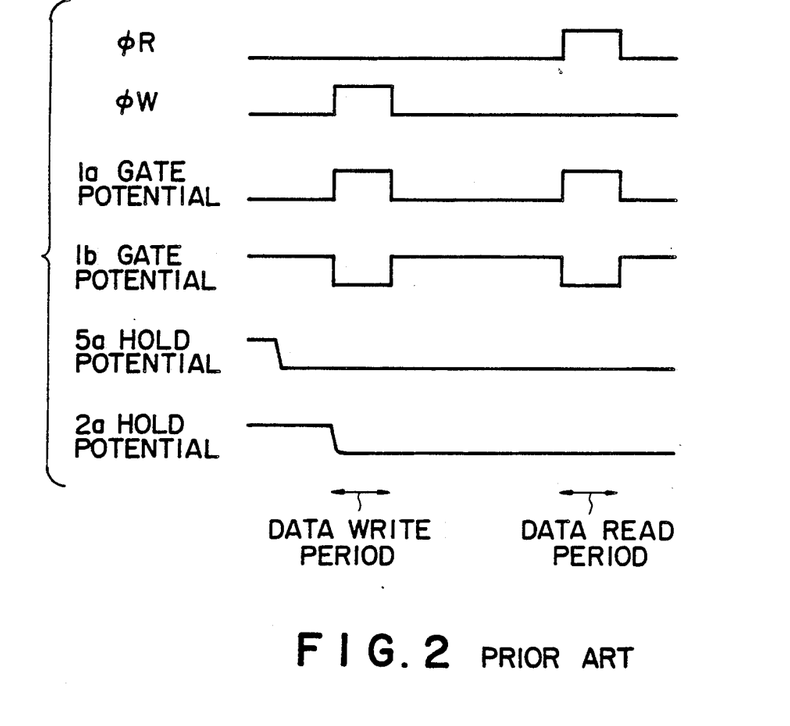
FIGS. 2 to 4 are timing charts for explaining the operation of the conventional device shown in FIG. 1, respectively.

A typical circuit example of a conventional semiconductor RAM and its timing chart are shown in FIGS. 1 and 2, respectively. As shown, data write operation from a data line 5 to a holding circuit 2 and data read operation from the holding circuit 2 to the data line 5 are conducted through a transmission gate 1 comprised of an N-type MOS transistor 1a and a P-type MOS transistor 1b. This transmission gate 1 is controlled by a control circuit 4 on the basis of a write clock $\phi$ W and a read clock $\phi$ R delivered thereto. In that case, the conventional circuit is constructed to allow both the N-type MOS transistor 1a and the P-type MOS transistor 1b constituting the transmission gate 1 to be turned on both at the time of write operation and at the time of read operation.

Figure 3:
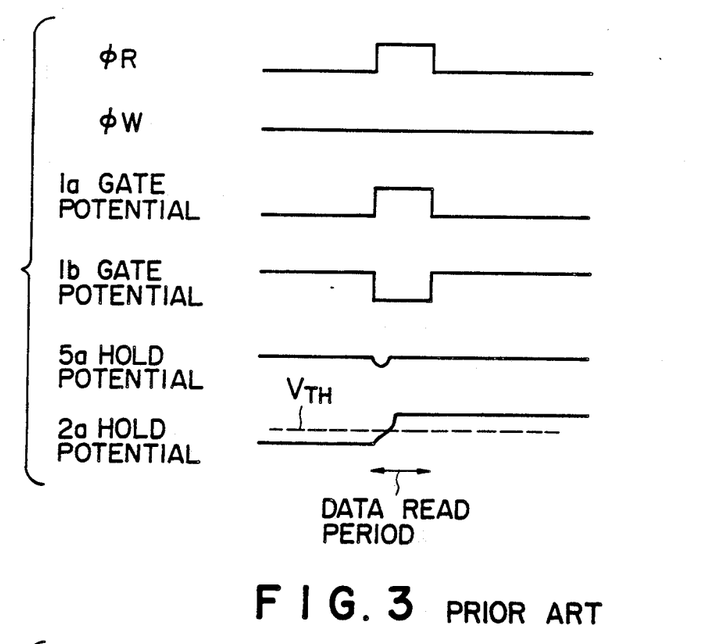
Figure 4:
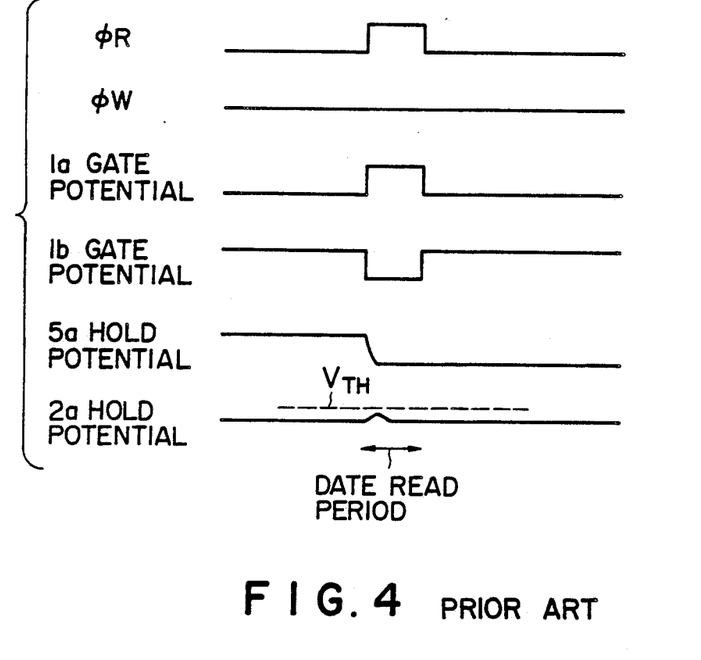

In the circuit shown in FIG. 1, a stray capacitor 5a exists on the data line 5 in associated therewith and the data holding circuit 2 has a capacitor 2a therein. In the case of reading out, from the holding circuit 2, a potential different from a potential stored in the stray capacitor 5a of the data line 5, charge transfer takes place between the stray capacitor 5a of the data line 5 and the capacitor 2a of the data holding circuit 2 immediately after the transmission gate 1 is turned on, so that a hold potential of the holding circuit 2 changes. If the circuit is not suitably designed, such a hold potential may vary to much degree to exceed above a threshold voltage $V_{TH}$ of the holding circuit. Thus, as shown in FIG. 3, the data held in the holding circuit 2 may change to a different value.

For a measure therefor, a method is adopted to suppress the value of the stray capacitor 5a of the data line 5 so that it is equal to a small value, or to allow the capacitor 2a of the holding circuit 2 to have a large value, thereby to hold down a change in a hold potential of the holding circuit 2 to a small value so that it does not exceed above a threshold value $V_{TH}$, thus to prevent data held from being changed.

However, with this method, the restriction on the mask pattern would be increased and the area of the mask pattern would be also increased. Particularly in a RAM including a large number of data holding circuits 2, such an influence would be conspicuously exhibited.

SUMMARY OF THE INVENTION

Therefore, an object of this invention is to eliminate the restriction on a mask pattern which has been implemented in order to prevent an erroneous operation as described above. Namely, the object of this invention resides in provision of a semiconductor memory device free from an erroneous operation and having a reduced mask pattern area.

To achieve this object, this invention provides a semiconductor memory device in which a data line and a holding circuit for storing data thereon are connected through a transmission gate comprised of an N-type MOS transistor and a P-type MOS transistor, wherein the semiconductor memory device includes an initial potential setting circuit for setting an initial potential on the data line prior to readout operation of data from the holding circuit, and a control circuit operative to allow both the P-type and the N-type MOS transistors constituting the transmission gate to be turned on at the time of writing data into the holding circuit, and to allow one of the N-type and the P-type MOS transistors to be turned on at the time of reading data from the holding circuit.

In addition, this invention also provides a semiconductor memory device constructed above, wherein a threshold voltage of the MOS transistor of the transmission gate which is turned on at the time of data read operation is set to a value larger than threshold voltage of the holding circuit.

In the device according to this invention, in the case of reading out data held in the holding circuit onto the data line, the data line is first set to have an initial potential, thereafter one conductivity type MOS transistor of the transmission gate is turned on. Thus, data held in the holding circuit is read onto the data line. At this time, where an initial potential on the data line and a hold potential of the holding circuit (data held therein) are different from each other, a charge transfer occurs between the stray capacitor of the data line and the capacitor in the holding circuit, so that the hold potential varies. Such a change in the hold potential is applied across the gate and the source of one MOS transistor which has been turned on of the transmission gate. By a change in a voltage between the gate and the source, an on resistance of the MOS transistor is increased. As a result, a change in a hold potential by the charge transfer between the data line and the holding circuit is suppressed to a small extent, and therefore does not exceed above a threshold voltage of the holding circuit.

Further, where a threshold value of the transistor of the transmission gate which is turned on at the time of data read operation is set to a value larger than the threshold voltage of the holding circuit, a change in the hold potential reaches the threshold voltage of the transistor before it reaches the threshold voltage of the holding circuit, with the result that the transistor concerned is turned off. This guarantees the fact that a change in the hold potential does not exceed above the threshold value of the holding circuit.

BRIEF DESCRIPTION OF THE DRAWINGS

In the accompanying drawings:

FIGS. 11, 13 and 15 are characteristic diagrams for explaining a change in on resistance of the transmission gate, respectively.

DESCRIPTION OF THE PREFERRED EMBODIMENTS

Preferred embodiments according to this invention will be described with reference to the attached drawings.

Figure 5:
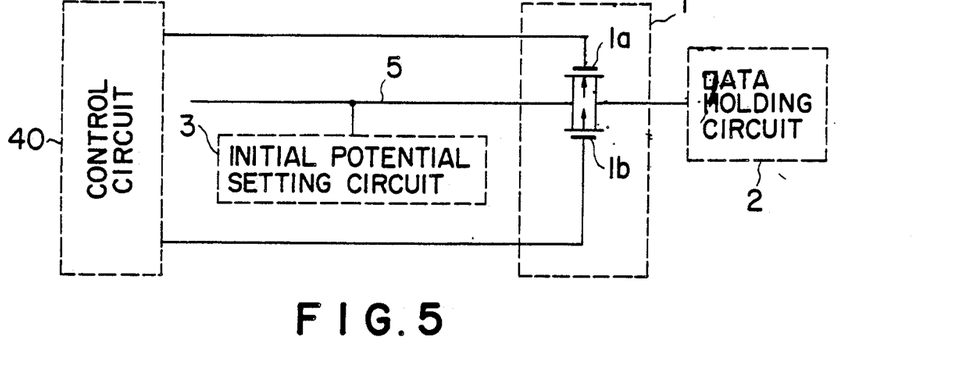
FIG. 5 is a block diagram showing the configuration of an embodiment according to this invention.

Initially referring to FIG. 5, there is shown an embodiment of a semiconductor memory device according to this invention, including an initial potential setting circuit 3 connected to a data line 5. This circuit 3 is operative to set an initial potential on the data line 5 prior to data read operation. A control circuit 40 is constructed to allow only one of the N-type MOS transistor 1a and the P-type MOS transistor 1b constituting the transmission gate 1 to be turned on at the time of data read operation. For example, after the initial potential setting circuit 3 initially sets a potential of low level on the data line 5, the control circuit 40 allows the P-type transistor 1b of the transmission gate 1 to be turned on, or after the initial potential setting circuit 3 initially sets a potential of high level on the data line 5, the control circuit 40 allows the N-type transistor 1a of the transmission gate 1 to be turned on, whereby data read operation from the holding circuit 2 is conducted.

The circuit configuration of respective components of this device will now be described with reference to FIG. 6. The transmission gate 1 and the data holding circuit 2 employ the configuration similar to those of the conventional ones. Namely, the transmission gate 1 includes N-type transistor 1a and P-type transistor 1b. One of the source and the drain of each of transistors 1a and 1b is connected to the data line 5, and the other thereof is connected to the input/output line 2c of the data holding circuit 2. The data holding circuit 2 includes a positive feedback circuit 2b connected to the input/output line 2c. This positive feedback circuit 2b inputs and holds data on the input line 2c for a time period during which the write clock $\phi$ W is at high level. A capacitor 2a exists between the input/output line 2c of the data holding circuit 2 and ground. In addition, a stray capacitor 5a exists between the data line 5 and ground.

The initial potential setting circuit 3 includes a P-type transistor 3a having a source and a drain connected to the data line 5 and a voltage source $V_{DD}$, respectively, and a logic gate 3b for providing a gate control signal for the transistor 3a in accordance with an initial potential setting clock $\phi$ P. This logic gate 3b may be comprised of, e.g., a NOT circuit as shown.

The control circuit 40 includes a logic gate 4a for providing a signal indicative of a logical sum of the read clock $\phi$ R and the write clock $\phi$ W, and a logic gate 4b for delivering a gate control signal to the N-type transistor 1a of the transmission gate 1 in accordance with an output from the logic gate 4a. For example, the logic gate 4a may be comprised of a NOR circuit and the logic gate 4b may be comprised of a NOT circuit, respectively. In addition, the control circuit 40 includes a logic gate 4c for applying a gate control signal to the P-type transistor 1b of the transmission gate 1 in accordance with the write clock $\phi$ W. This logic gate 4c may be comprised of, e.g., a NOT circuit.

Figure 7:
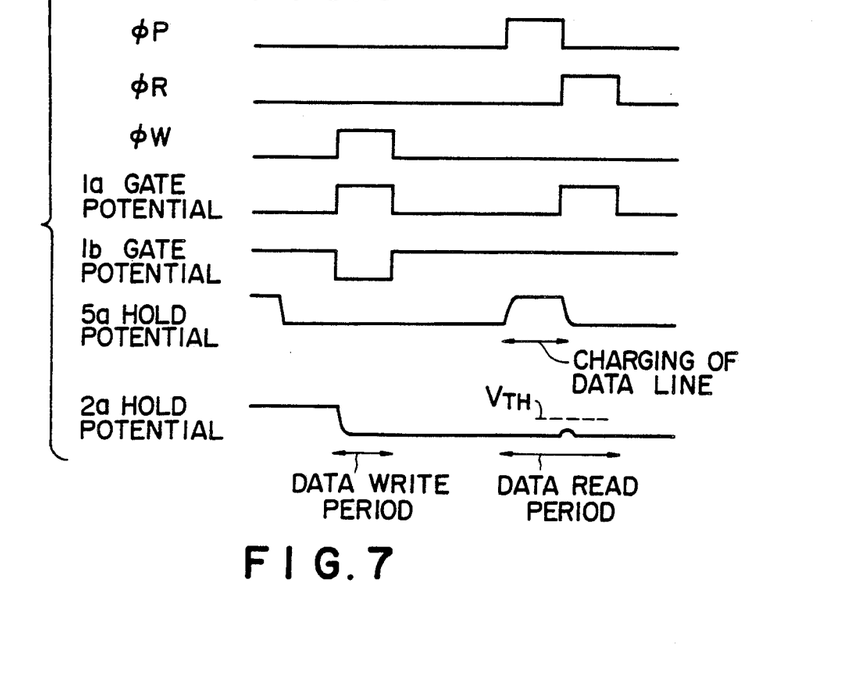
FIG. 7 is a timing chart for explaining the operation of the embodiment shown in FIG. 6.

The operation of this embodiment will be described with reference to the timing chart shown in FIG. 7.

At the time of data write operation, the N-type and the P-type transistors 1a and 1b constituting the transmission gate 1 are turned on in response to high level of the write clock $\phi$ W. Thus, data on the data line 5 is written into the holding circuit 2. On the other hand, at the time of data read operation, the initial potential setting circuit 3 becomes active in response to high level of the initial potential setting clock $\phi$ P. As a result, a potential of high level is set on the data line 5 by the initial potential setting circuit 3, whereby charging of the data line 5 is conducted. Thereafter, the N-type transistor 1a of the transmission gate 1 is turned on in response to high level of the read clock $\phi$ R. Thus, data in the holding circuit 2 is read out onto the data line 5. At this time, where data held in the data holding circuit 2 is at high level, the data line 5 holds high level initially set. In contrast, where data held in the holding circuit 2 is at low level, discharging of the data line 5 of which potential has been initially set to high level is conducted through the N-type transistor 1a of the transmission gate 1 and the holding circuit 2. Thus, data of low level is read out.

Figure 8:
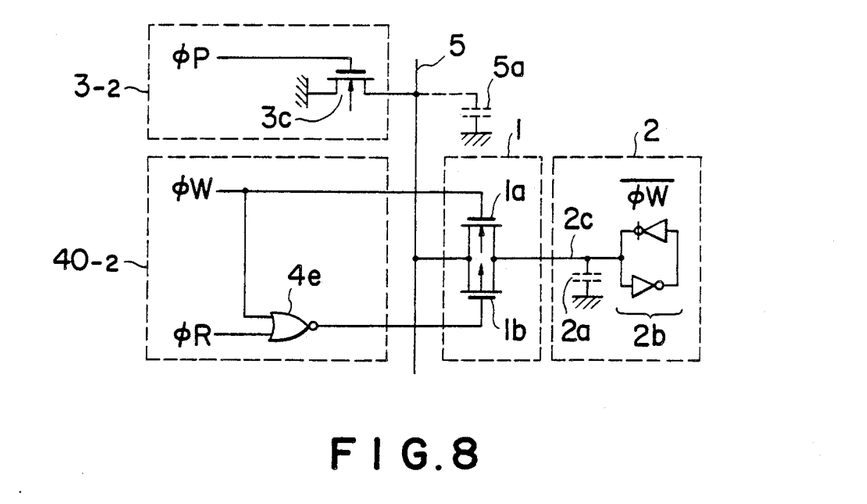
FIG. 8 is a circuit diagram showing another embodiment of this invention.

Referring to FIG. 8, there is shown the circuit configuration of respective components of another embodiment according to this invention. This embodiment differs from the above-mentioned embodiment in the configuration of the initial potential setting circuit 3-2 and the control circuit 40-2. Namely, the initial potential setting circuit 3-2 is constructed to include an N-type transistor 3c having a source and a drain connected to the data line 5 and ground, respectively, to allow the N-type transistor 3c to be turned on by high level of the initial potential setting clock $\phi$ P to initially set a potential of low level on the data line 5. Further, the control circuit 40-2 is constructed to include a logic gate 4e comprised of a NOR circuit having a write clock $\phi$ W and a read clock $\phi$ R as respective inputs to apply an output from the logic gate 4e to the gate of the P-type transistor 1b of the transmission gate 1. In addition, the write clock $\phi$ W is applied to the gate of the N-type transistor 1a of the transmission gate 1 as it is.

Figure 9:
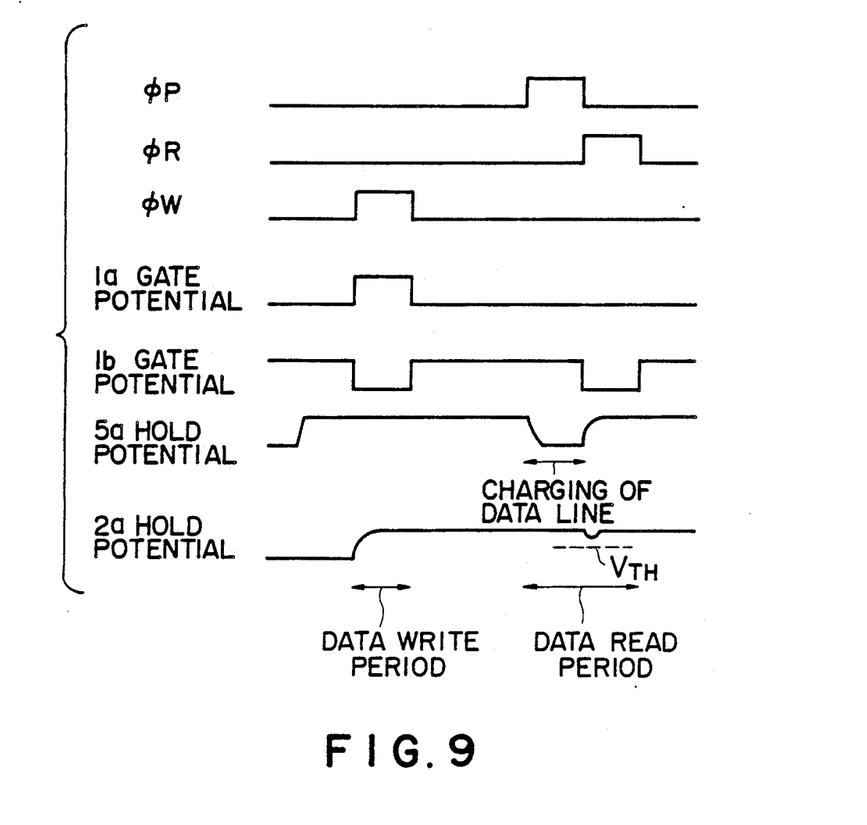
FIG. 9 is a timing chart for explaining the operation of the embodiment shown in FIG. 8, FIGS. 10, 12 and 14 are circuit diagrams for explaining the operation of a transmission gate, respectively.

The operation of this embodiment will be described with reference to the timing chart shown in FIG. 9. At the time of data write operation, the operation similar to that of the above-mentioned embodiment is performed. On the other hand, at the time of data read operation, a potential of low level is initially set on the data line 5 by the initial potential setting circuit 3, whereby charging of the data line 5 is conducted. Then, the P-type transistor 1b of the transmission gate 1 is turned on. Thus, data in the holding circuit 2 is read out. At this time, where data held in the holding circuit 2 is at low level, the data line 5 holds a potential of low level initially set. In contrast, where data held in the data holding circuit 2 is at high level, discharging of the data line 5 of which potential has been initially set to low level is conducted through the P-type transistor 1b of the transmission gate 1 and the holding circuit 2. Thus, data of high level is read out.

Figure 6:
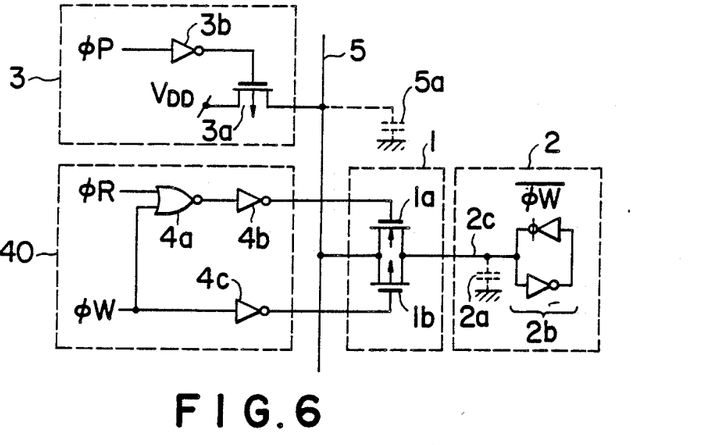
FIG. 6 is a circuit diagram showing the embodiment shown in FIG. 5.
Figures 10, 11:
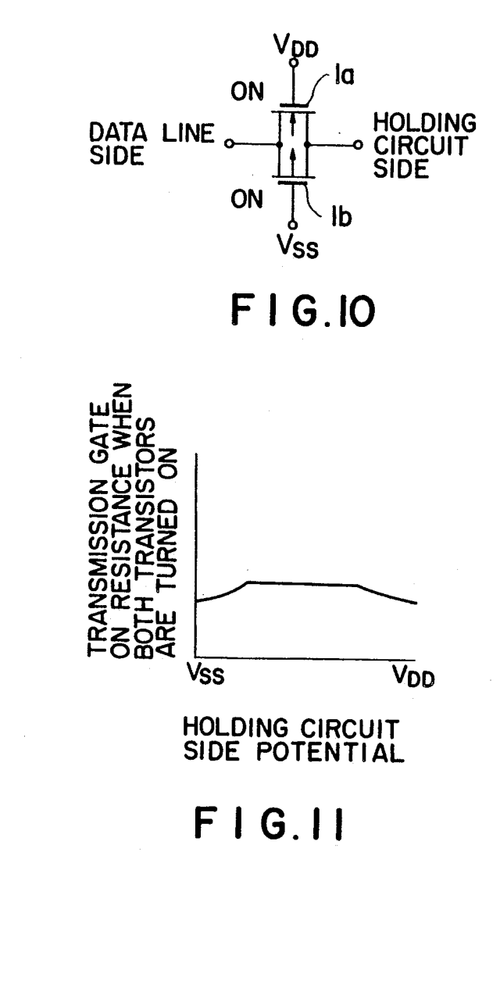
Figures 12, 13:
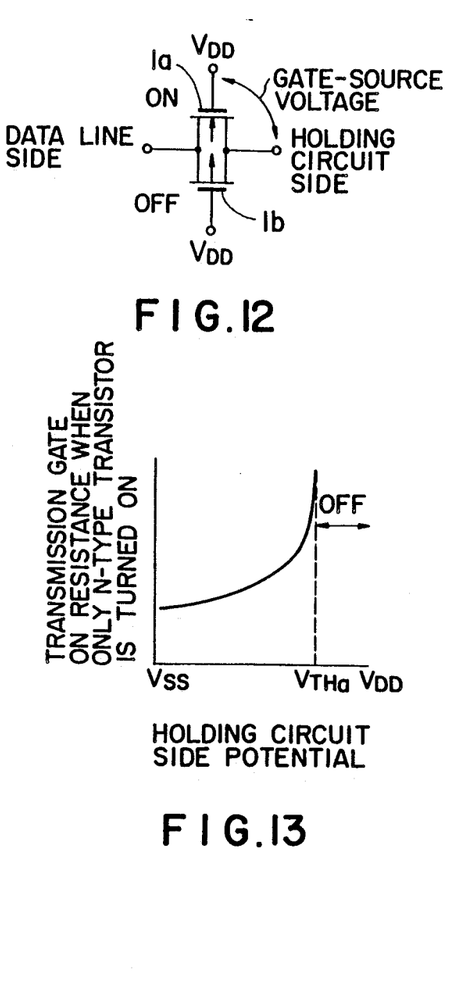
Figures 14, 15:
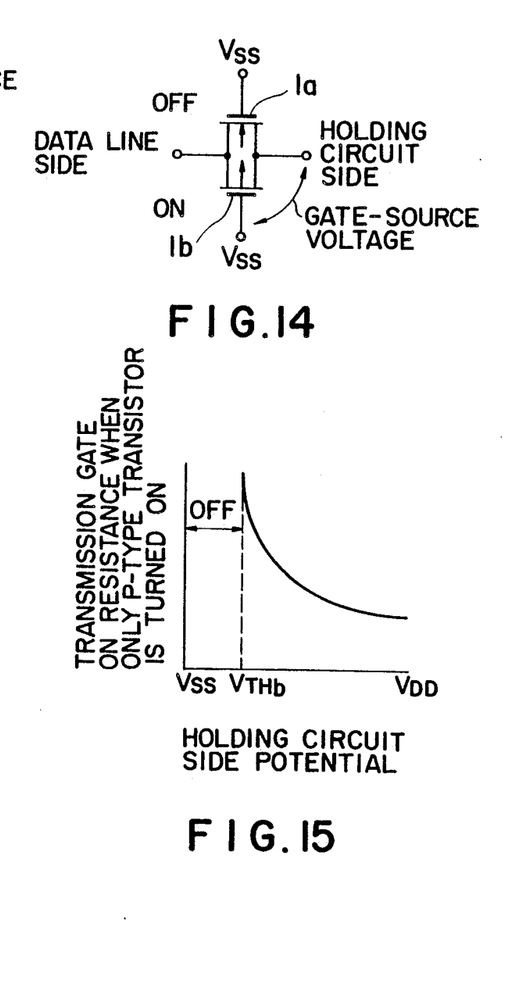

As described above, when data of low level is read out in the embodiment shown in FIG. 6, and when data of high level is read out in the embodiment shown in FIG. 8, a potential held by the capacitor 2a changes by the charge transfer between the data line 5 and the holding circuit 2. However, such a change is held down to a small value, as shown in FIGS. 7 and 9, and therefore does not reach the threshold voltage $V_{TH}$ of the holding circuit 2. The reason will be described with reference to FIGS. 10 to 15.

Where the P-type and N-type transistors 1b and 1a are both caused to be turned on as shown in FIG. 10, the transmission gate on resistance is substantially constant as shown in FIG. 11. In contrast, where only one of the P-type and N-type transistors 1b and 1a is caused to be turned on as shown in FIG. 12 or 14, the potential difference between the gate and the source shown in FIGS. 12 and 14 becomes small according as a change in the hold potential. As a result, the on resistance of the transmission gate becomes large as shown in FIGS. 13 and 15. When a change in the hold potential reaches a threshold voltage $V_{THa}$ or $V_{THb}$ of a transistor of the transmission gate which has been caused to be turned on, this transistor is turned off. Thus, the transmission gate is brought into a state of high impedance.

By the operation of the transmission gate as described above, as compared to the case where transistors of the both conductivity types of the transmission gate are caused to be turned on as in the prior art at the time of data read operation, where only one of the transistors thereof is caused to be turned on as in this invention, on resistance of the transmission gate becomes large by a change in the hold potential due to a charge transfer. As a result, such a change in the hold potential is held down to a small value so that it does not exceed above a threshold voltage $V_{TH}$. Accordingly, the restriction on the mask pattern required for reducing a change in the hold potential will be also lessened.

Figure 16:
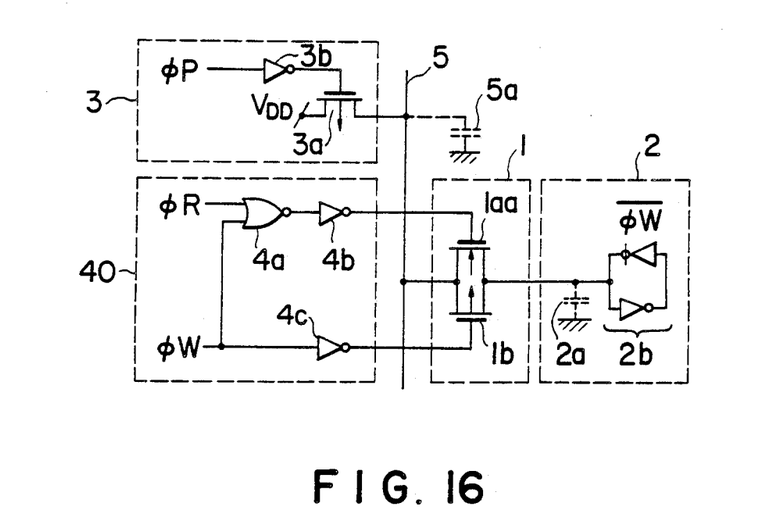
FIG. 16 is a circuit diagram of a modification of the embodiment shown in FIG. 6.

Referring to FIG. 16, there is shown a modification of the embodiment shown in FIG. 6. This modified embodiment differs from the embodiment shown in FIG. 6 in that a threshold value $V_{THaa}$ of an N-type transistor 1aa of the transmission gate 1 is set to a value larger than the threshold value $v_{TH}$ of the holding circuit 2 by doping into the channel portion thereof.

Figure 17:
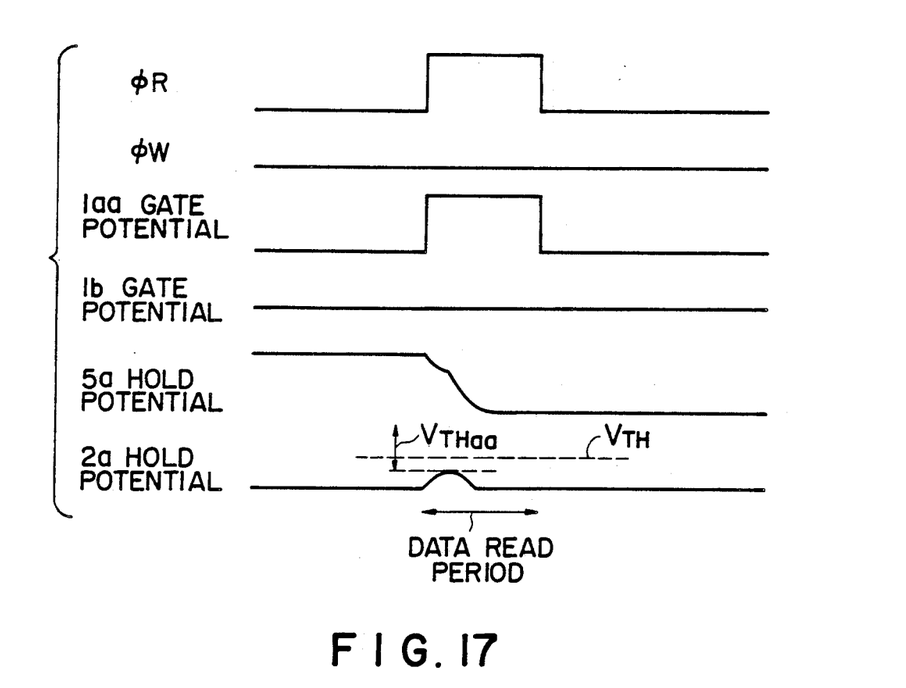
FIG. 17 is a timing chart for explaining the operation of the modification shown in FIG. 16.

The operation of this modified embodiment will be described with reference to the timing chart shown in FIG. 17. Where data held in the holding circuit 2 is at low level, charge transfer takes place between the capacitor 5a of the data line 5 and the capacitor 2a of the holding circuit 2 at the time of data read operation, so that a hold potential varies. However, such a change of the hold potential reaches the threshold value $V_{THaa}$ of the N-type transistor 1aa of the transmission gate 1 before it reaches the threshold value $V_{TH}$ of the holding circuit 2. As a result, the N-type transistor 1aa of the transmission gate 1 is turned off. Thus, there is no possibility that the above-mentioned change in the hold potential reaches the threshold value of the holding circuit 2. Thereafter, the hold potential is returned to low level by the positive feedback circuit 2b of the holding circuit 2. As a result, the N-type transistor 1aa of the transmission gate 1 is turned on for a second time, so discharging of the data line 5 of which potential has been initially set to low level is conducted through the N-type transistor 1aa of the transmission gate 1 and the holding circuit 2. Thus, data of low level is read out.

Figure 18:
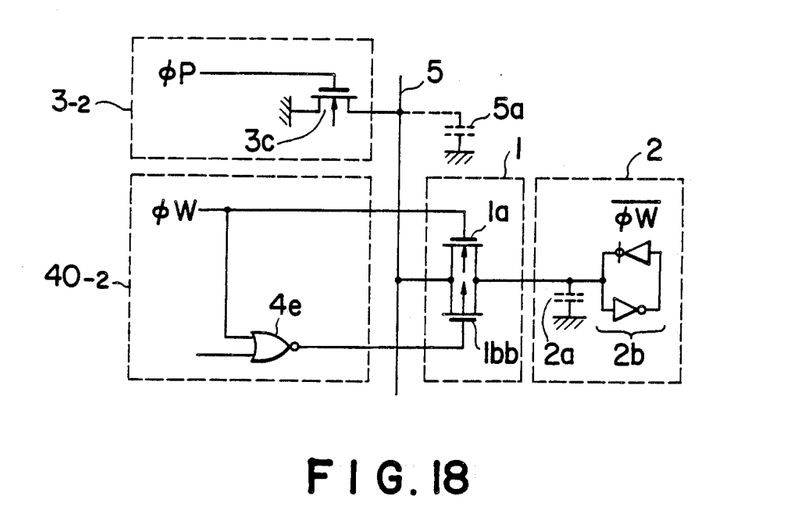
FIG. 18 is a circuit diagram of a modification of the embodiment shown in FIG. 8.

Referring to FIG. 18, there is shown a modification of the embodiment shown in FIG. 8. This modified embodiment differs from the above-mentioned embodiment shown in FIB. 8 in that a threshold value $V_{THbb}$ of a P-type transistor 1bb of the transmission gate is set to a value larger than the threshold value $V_{TH}$ of the holding circuit 2 by doping into the channel portion thereof.

Figure 19:
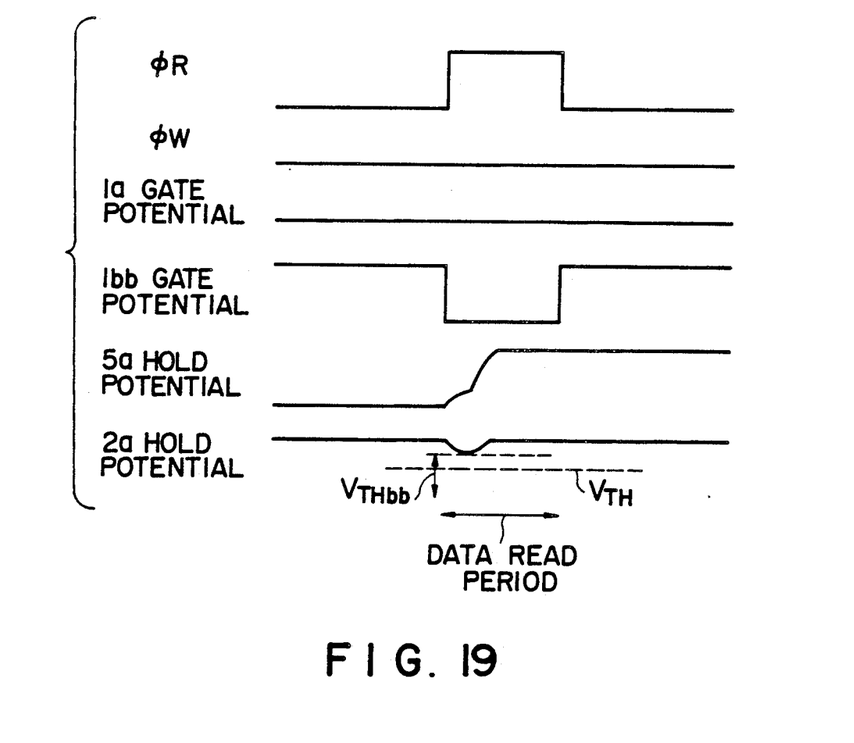
FIG. 19 is a timing chart for explaining the operation of the modification shown in FIG. 18.

The operation of this modified embodiment will be described with reference to the timing chart shown in FIG. 19. Where data held in the data holding circuit 2 is at high level, a charge transfer takes place between the capacitor 5a of the data line 5 and the capacitor 2a of the holding circuit 2 at the time of data read operation, so that a hold potential changes. However, such a change reaches the threshold value $V_{THbb}$ of the P-type transistor 1bb of the transmission gate 1 before it reaches the threshold value $V_{TH}$ of the holding circuit 2. As a result, the transistor 1bb is turned off. Thus, there is no possibility that the above-mentioned change in the hold potential reaches the threshold value $V_{TH}$ of the holding circuit 2. Thereafter, the hold potential is returned to low level by the positive feedback circuit 2b of the holding circuit 2. As a result, the P-type transistor 1bb of the transmission gate 1 is turned on for a second time, so discharging of the data line 5 of which potential has been initially set to low level is conducted through the P-type transistor 1bb of the transmission gate 1 and the holding circuit 2. Thus, data of high level is read out.

As stated above, when a setting is made such that the threshold value of the transistor of the transmission gate which is turned on at the time of data read operation is higher than the threshold value of the holding circuit, there is no possibility that a change in the hold potential due to charge transfer exceeds above the threshold value of the data holding circuit. Accordingly, this results in no erroneous operation at the time of read operation and no restriction on mask pattern. The merit resulting from the fact that the mask pattern area can be reduced will be conspicuously exhibited especially in a RAM including a large number of holding circuits.

What is claimed is:

1. A semiconductor memory device in which a data line and a holding circuit for storing data thereon are connected through a transmission gate comprised of an N-type MOS transistor and a P-type MOS transistor, said semiconductor memory device comprising:
    an initial potential setting circuit for setting an initial potential on said data line prior to readout operation of data from said holding circuit, and
    a control circuit operative to allow both of said MOS transistors of said transmission gate to be turned on at the time of writing data into said holding circuit, and to allow one of said MOS transistors to be turned on at the time of reading data from said holding circuit.

2. A device as set forth in claim 1, wherein when said initial potential is a potential of a predetermined low level, said one MOS transistor is said P-type MOS transistor.

3. A device as set forth in claim 1, wherein when said initial potential is a potential of a predetermined high level, said one MOS transistor is said N-type MOS transistor.

4. A device as set forth in claim 1, wherein said one MOS transistor has a threshold voltage that is larger than a threshold voltage of said holding circuit.

5. A device as set forth in claim 4, wherein said one MOS transistor is subjected to doping into its channel portion so that said threshold voltage thereof is larger than that of said holding circuit.

* * * * *